United States Patent [19]
Kumar

[11] Patent Number: 6,160,748
[45] Date of Patent: Dec. 12, 2000

[54] APPARATUS AND METHOD FOR MAINTAINING BIT LINE CHARGE STATE DURING A READ OPERATION

[75] Inventor: Manoj Kumar, San Jose, Calif.

[73] Assignee: International Business Machines Corporation, Armonk, N.Y.

[21] Appl. No.: 09/545,615

[22] Filed: Apr. 6, 2000

Related U.S. Application Data

[62] Division of application No. 09/329,458, Jun. 10, 1999, which is a division of application No. 09/019,895, Feb. 6, 1998, Pat. No. 5,959,916.

[51] Int. Cl.[7] .................................................. G11C 13/00
[52] U.S. Cl. ..................... 365/205; 365/204; 365/189.01
[58] Field of Search .................................. 365/205, 204, 365/203, 189.01, 230.01

[56] References Cited

U.S. PATENT DOCUMENTS 5,777,942  7/1998  Dosaka et al. .
5,949,729  9/1999  Suyama ...................... 365/205

*Primary Examiner*—Terrell W. Fears
*Attorney, Agent, or Firm*—Russell D. Culbertson; Anthony V. S. England

[57] ABSTRACT

A keeper circuit (14) is included in a memory arrangement comprising a column of memory cells (20) connected by a bit line pair (16,18). The keeper circuit (14) comprises two keeper transistors. One keeper transistor (86) is connected to control current from a supply voltage source to one bit line (16) and the other keeper transistor (88) is connected to control current from the supply voltage source to the other bit line (18) of the bit line pair. Current through each keeper transistor (86, 88) is controlled by the charge state of the opposite bit line. A low charge state on one bit line causes the keeper transistor associated with the opposite bit line to conduct and maintain the charge level of the opposite bit line.

10 Claims, 2 Drawing Sheets

APPARATUS AND METHOD FOR MAINTAINING BIT LINE CHARGE STATE DURING A READ OPERATION

CROSS REFERENCE TO RELATED APPLICATIONS

This application is a divisional application of application Ser. No. 09/329,458, filed Jun. 10, 1999, entitled "Bit Line Precharge Apparatus and Method" which is a divisional application of application Ser. No. 09/019,895, filed Feb. 6, 1998, now U.S. Pat. No. 5,959,916 entitled "Write Driver and Bit Line Precharge Apparatus and Method." The entire content of each of these prior related applications is incorporated herein by this reference.

TECHNICAL FIELD OF THE INVENTION

This invention relates to electronic computer memory systems and particularly to cache memory. The invention encompasses both an apparatus and method for maintaining a desired charge state on a bit line pair during a read operation from a memory cell connected to the bit line pair.

BACKGROUND OF THE INVENTION

The memory available to a microprocessor commonly includes special high speed memory referred to as cache memory or simply cache. Cache memory comprises an array of individual memory cells, each memory cell adapted to store one bit of data. A number of memory cells are arranged in a column connected by two conductors referred to as a bit line pair. The memory arrangement includes a number of such columns of memory cells. Data is written to or transferred from a particular memory cell in the arrangement via the bit line pair associated with the column of memory cells in which the particular memory cell is included. A voltage signal in a "high" range on one bit line of the bit line pair with a "low" voltage signal on the opposite bit line represents one logical state. A voltage signal in a "high" range on the opposite bit line and corresponding "low" voltage signal on the one bit line represents the opposite logical state. The memory cells are connected in rows by word lines which are used to activate a particular memory cell in a column and allow data, that is, one logical state or the other, to be written to or transferred from the particular cell.

A write driver is used to control the charge state of the bit line pairs during a write operation to a memory cell within a column. The write driver comprises a circuit connected to the bit line pair which causes the bit lines in the pair to have the desired voltage state representing the data to be stored in a memory cell. A column decoder and sense amplifier are also connected to the bit line pair for reading data which has been stored in the memory cells. A bit line precharge circuit commonly accompanies the write driver circuit. The bit line precharge circuit operates to charge both lines of the bit line pair prior to a read or write operation.

In a read operation, the logical high charge must be maintained on one of the bit lines of the pair, while the charge state on the opposite bit line is allowed to decay through the selected memory cell. Once a minimum voltage differential has developed between the two bit lines, the sense amplifier is activated to convert the differential voltage signals appearing on the bit lines to a true digital signal.

In the prior art, the charge on one bit line is maintained only through a small transistor in the selected memory cell. However, the capacitance associated with the bit line and junction capacitance associated with the transfer gate device of each memory cell in the column can cause the charge on the bit line to decay during a long read operation. This decay in the charge on the bit line which is intended to be maintained at a high level, reduces the voltage differential between the two bit lines of the bit line pair and may interfere with the operation of the sense amplifier. That is, a reduced voltage differential on the bit line pair during the read operation may cause the sense amplifier to incorrectly sense the data appearing on the bit line pair, and produce an incorrect result.

SUMMARY OF THE INVENTION

It is an object of the invention to provide an apparatus and method for maintaining a proper charge state on one bit line of a bit line pair during a read operation.

To accomplish this object, a keeper circuit is included in a memory arrangement comprising a column of memory cells connected by a bit line pair. The keeper circuit comprises two keeper transistors. One keeper transistor is connected to control current from a supply voltage source to one bit line and the other keeper transistor is connected to control current from the supply voltage source to the other bit line of the bit line pair. Current through each keeper transistor is controlled by the charge state of the opposite bit line. A low charge state on one bit line causes the keeper transistor associated with the opposite bit line to conduct and maintain the charge level of the opposite bit line. This keeper arrangement thus ensures that the desired bit line is maintained at the desired high charge level throughout a long read operation, despite the capacitance associated with the bit line and the memory cells.

These and other objects, advantages, and features of the invention will be apparent from the following description of the preferred embodiments, considered along with the accompanying drawings.

DESCRIPTION OF THE PREFERRED EMBODIMENTS

Figure 1:
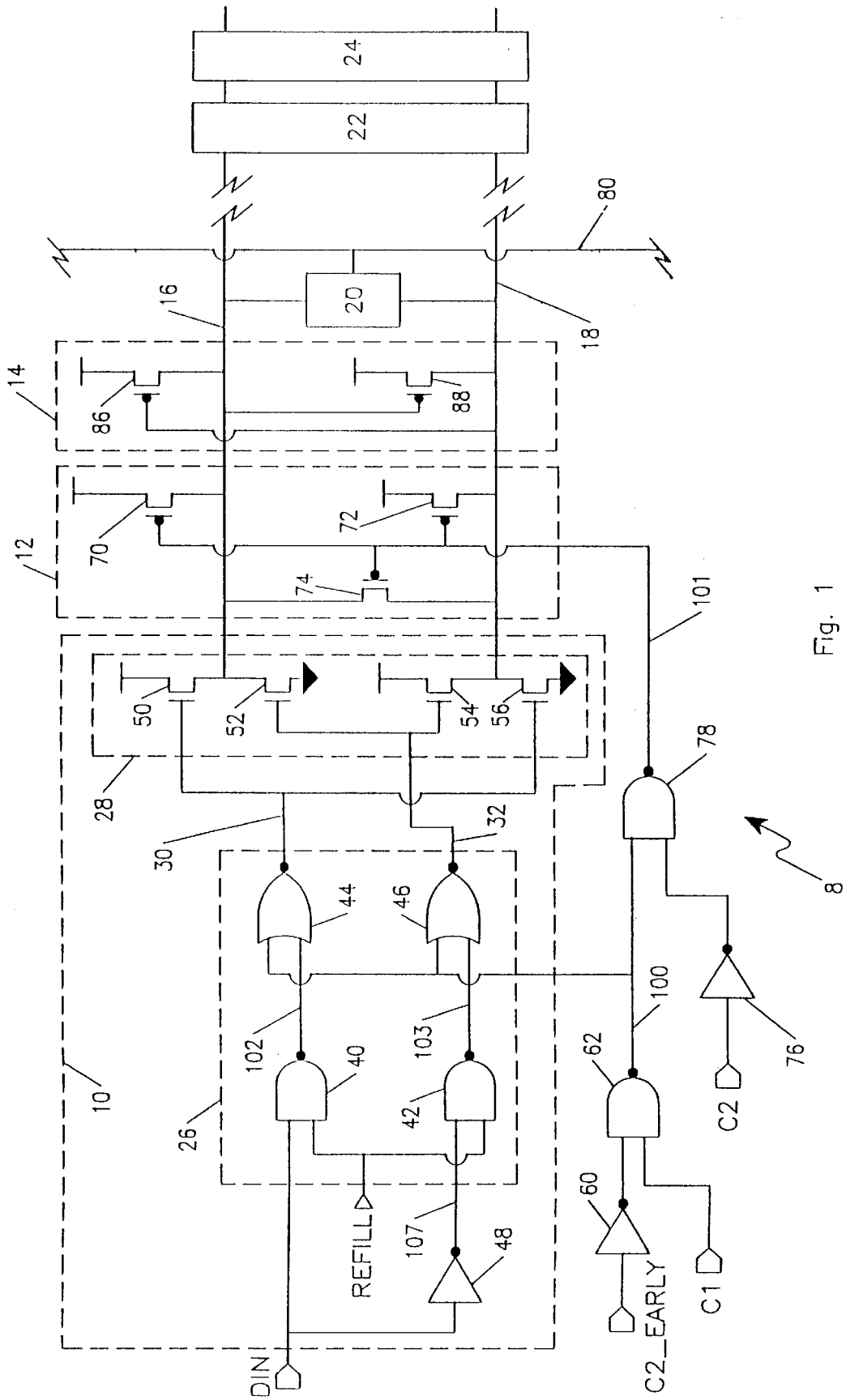
FIG. 1 is an electrical schematic diagram showing a memory arrangement and keeper circuit embodying the principles of the invention.

Referring to FIG. 1, a circuit 8 embodying the principles of the invention includes a keeper circuit 14. Keeper circuit 14 is associated with a bit line pair comprising a first bit line 16 and a complement or second bit line 18. The bit line pair is connected to a plurality of individual memory cells, including memory cell 20.

The illustrated circuit 8 also includes a write driver circuit 10, a precharge circuit 12, a column decoder circuit 22, and a sense amplifier circuit 24. Write driver circuit 10 operates under the control of signals derived from system clock signals C1 and C2_Early to write data to selected memory cells 20 across bit lines 16 and 18. Precharge circuit 12 controls the precharging of bit lines 16 and 18. Column decoder circuit 22 and sense amplifier circuit 24 cooperate in reading data from the memory cells 20. Write driver circuit 10, precharge circuit 12, column decoder circuit 22, and sense amplifier circuit 24 are described in this disclosure only for the purpose setting out the environment in which keeper circuit 14 functions. Those skilled in the art will appreciate that keeper circuit 14 is not limited to use with the particular illustrated write driver, precharge, column decoder, and sense amplifier arrangements.

Write driver circuit 10 includes a write driver logic circuit 26 and a tri-state buffer arrangement 28. The write driver logic circuit 26 includes two output lines, a first output 30 corresponding to the first bit line 16 and a second output 32 corresponding to the second bit line 18. The write driver logic circuit 26 receives data from a data input DIN, a write enable or refill input REFILL, and a data propagation clock signal at node 100, and operates to provide the desired logic state at the two outputs 30 and 32. The tri-state buffer arrangement 28 is controlled by the two output lines 30 and 32 to apply the desired charge state to the bit lines 16 and 18.

Data input DIN receives data from a cache reload buffer (not shown). The refill input REFILL dictates a write mode in one logic state and a read mode in the opposite logic state.

Write driver logic circuit 26 includes two NAND gates 40 and 42 and two NOR gates 44 and 46. The data input signal on DIN is applied as one input to NAND gate 40 and is also inverted at inverter 48 and the resulting inverted signal applied as an input to the other NAND gate 42. The refill signal at REFILL is applied to the other input of both NAND gates 40 and 42. NAND gates 40 and 42 and inverter 48 comprise an intermediate logic arrangement which provides a certain logic state at the intermediate outputs, nodes 102 and 103, depending upon the data at DIN and refill signal.

The output of NAND gate 40 forms an input for NOR gate 44, whereas the output of the other NAND gate 42 forms an input for the other NOR gate 46. The data propagation clock signal at node 100 provides the other input of both NOR gates 44 and 46.

The preferred tri-state buffer arrangement 28 comprises two charging transistors and two drawdown transistors, all NMOS devices in the illustrated form of the invention. A first charging transistor 50 has its drain-source current path connecting the supply voltage $V_{dd}$ and the first bit line 16. A first drawdown transistor 52 has its drain-source current path connecting the first bit line 16 and ground. A second charging transistor 54 has its drain-source current path connecting the supply voltage $V_{dd}$ and the second bit line 18. Finally, a second drawdown transistor 56 has its drain-source current path connecting the second bit line 18 and ground. The gates of the first charging transistor 50 and second drawdown transistor 56 are both connected to the first output 30 of the write logic circuit 26, while the gates of the second charging transistor 54 and first drawdown transistor 52 are connected to the second output 32 from the write driver logic circuit.

The data propagation clock signal is derived from system clock signals C1, or the first clock signal, and a second clock signal C2$_{13}$ Early. The C2__Early clock signal is inverted at inverter 60 and the resulting inverted signal is applied as one input of NAND gate 62. Clock input C1 is applied as the other input of NAND gate 62. The output of the NAND gate 62 at node 100 remains at a logical high state except when the first clock signal C1 is high and the second clock signal C2__Early is low. The C1 high and C2__Early low condition produces a low signal at node 100 and this low signal comprises the data propagation clock signal which times when data is forced onto the bit line pair 16 and 18 by write driver 10 or is read from a selected memory cell.

As used in this disclosure the word "high" will be used to describe a logical high voltage state. The word "low" will be used to describe a logical low voltage state. The particular voltage ranges which may comprise a "high" state and a "low" state may vary from application to application and do not form a part of the invention.

In operation, the cache reload buffer (not shown) drives the data input, applying the desired logical state at DIN. Depending upon the data, either node 107 or DIN will be high and the other low. A high refill signal at REFILL facilitates a write mode of operation and forces one intermediate output, either node 102 or 103, low and the other of these two nodes high. A data propagation clock signal, that is, a low signal at node 100 in the presence of a high refill signal at REFILL, produces a desired logical state at the data outputs 30 and 32. The desired logical state at outputs 30 and 32 drives the tri-state buffer 28 to force the desired charge state on the bit lines 16 and 18. A high signal at output 30 switches both the first charging transistor 50 and the second drawdown transistor 56 "on." At the same time the second output 32 remains low and the thus, second charging transistor 54 and first drawdown transistor 52 remain "off." In this state, the supply voltage $V_{dd}$ is applied to the first bit line 16 and the second bit line 18 is pulled down to ground. In the opposite logical condition in which the second output 32 is high and the first output 30 is low, the supply voltage $V_{dd}$ is applied through the second charging transistor 54 to the second bit line 18 whereas the first bit line 16 is pulled down to ground through the first drawdown transistor 52. In each case, the same logical output signal (either a high signal at output 30 or 32) operates both to apply the supply voltage $V_{dd}$ to a desired bit line, and pull the opposite bit line down to ground.

The method of writing data to the bit lines 16 and 18 according to the invention includes producing a first data output signal either high or low at the first output 30 and producing a complement second data output signal either high or low at the second output 32. The method also includes forcing a desired charge state on the first bit line 16 and a complement charge state on the second bit line 18 in response to the data output signals at the first and second outputs 30 and 32. A high signal at output 30 and low signal at output 32 results in one charge state on bit lines 16 and 18 while the opposite conditions at the outputs 30 and 32 result in the opposite charge state on the bit lines. According to the invention, the data output signals at outputs 30 and 32 are produced only in response to the data input DIN, the refill input REFILL, and the data propagation clock signal which comprises a low state at node 100. Thus, data may be written to the bit lines 16 and 18 only in the presence of the data propagation clock signal derived from system clocks C1 and C2__Early.

The precharge circuit 12 includes a first precharge transistor 70, a second precharge transistor 72, and a charge equalizing transistor 74, each a PMOS device in the illustrated form of the invention. The first precharge transistor 70 has its source-drain current path connecting the supply voltage $V_{dd}$ and the first bit line 16 whereas the second precharge transistor 72 has its source-drain current path connecting the supply voltage $V_{dd}$ to the second bit line 18. The equalization transistor 74 has its source-drain current path connecting the first and second bit lines 16 and 18, respectively. The gate of each transistor 70, 72, and 74 is connected to a precharge input at node 101 to receive a precharge clock signal.

The precharge clock signal applied at node 101 is derived from the data propagation clock signal at node 100 and a third clock signal C2 through a precharge clock signal arrangement including inverter 76 and NAND gate 78. Clock signal C2 is inverted at inverter 76 and the inverted signal applied as an input to NAND gate 78. The data propagation clock signal is applied as the second input to NAND gate 78. In operation, a low output at node 101 represents a precharge clock signal which switches "on" the three PMOS devices 70, 72, and 74. When the three PMOS devices 70, 72, and 74 are "on," both bit lines 16 and 18 are equalized to the same precharge level, supply voltage $V_{dd}$. When node 101 is high, no precharge signal is supplied to the three precharge devices 70, 72, and 74 and all three devices are "off" and have no effect on the charge state of the bit lines 16 and 18.

Figure 2:
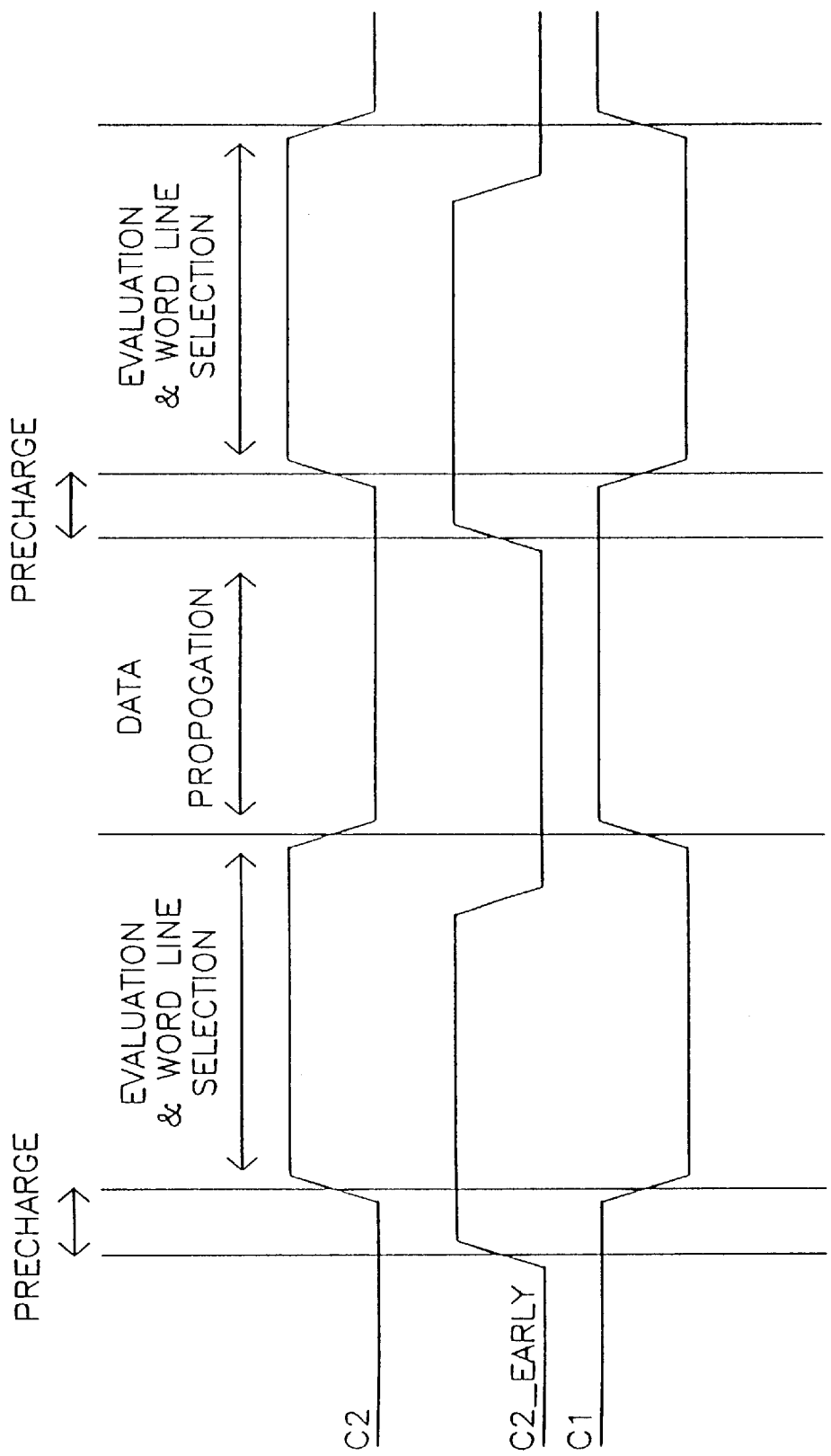
FIG. 2 is a timing chart showing the system clock signals employed by circuit shown in FIG. 1.

The synchronization between the write driver circuit 10 and precharge circuit 12 and the method of precharging the bit lines 16 and 18 may now be described with reference to FIG. 1 and to the timing chart shown in FIG. 2. The first clock input C1 is opposite in phase to the third clock input C2, whereas the second clock input C2_Early is well out of phase with signal C1, going high slightly earlier than clock signal C2. For example, C2_Early may go high on the order of 500 picoseconds before C2. When clock signal C1 goes high, signal C2_Early is low and this condition produces a data propagation clock signal at node 100. The circuit 8 goes into a data propagation mode in response to the data propagation clock signal. In the data propagation mode, data is written to or read from a selected memory cell 20 depending upon the state of the refill input REFILL. When the REFILL input signal is high, the circuit 8 is in a write mode, whereas when the REFILL input signal is low the circuit 8 is in a read mode. When the circuit 8 is in the write mode, the high going C1 signal causes either output 30 or output 32 to go high maintaining one of the bit lines 16 or 18 at $V_{dd}$ and pulling the other bit line to ground. However, when the second clock signal C2_Early goes high at the end of the C1 clock signal, the circuit 8 goes into a precharge mode. In the precharge mode the transistors 50, 52, 54, and 56 of the tri-state buffer 28 are all switched "off," and node 101, the precharge input, is forced low representing a precharge clock signal. In response to this precharge clock signal, that is, low state at node 101, the precharge PMOS devices 70, 72, and 74 are all switched "on" and both bit lines 16 and 18 are precharged to the supply voltage $V_{dd}$.

When the third clock signal C2 goes high, the precharge clock signal is removed and node 101 is forced high to switch "off" each of the precharge devices 70, 72, and 74. The write driver transistors 50, 52, 54, and 56 are also necessarily "off" since C1 is now low. At this point, circuit 8 is in an evaluation mode in which a word line 80 may be selected to select a particular memory cell 20 in the column. The high going edge of clock signal C1 produces a data propagation clock signal placing the circuit 8 once again in the data propagation mode, either a read mode or a write mode depending upon the state of the refill signal REFILL.

Keeper circuit 14 in FIG. 1 comes into play when data is read from a memory cell 20. Keeper circuit 14 includes a first keeper transistor 86 and a second keeper transistor 88. Both keeper transistors 86 and 88 are PMOS devices (P-type field effect transistors) in the illustrated form of the invention. First keeper transistor 86 has its source-drain current path connecting the supply voltage $V_{dd}$ to the first bit line 16, whereas second keeper transistor 88 has its source-drain current path connecting the supply voltage $V_{dd}$ to second bit line 18. The gate of keeper transistor 86 is connected to the second bit line 18, and the gate of keeper transistor 88 is connected to first bit line 16.

In the read operation, one of the bit lines must be maintained in a high state through a small transistor (not shown) in the memory cell 20 from which data is being read. It is difficult for the small memory cell transistor to sustain the high bit line level in a long read operation considering the junction capacitance of the transfer gates in the memory cells and the capacitance of the bit line itself. With keeper circuit 14, however, the low side bit line activates the keeper transistor associated with the opposite bit line and maintains that opposite bit line at the supply voltage level in the long cycle to compensate for the bit line leakage. Thus, each keeper transistor 86 and 88 functions as a switching device. Keeper transistor 86 is activated by sensing a low charge state on bit line 18, while keeper transistor 88 is activated by sensing a low charge state on bit line 16. The "sensing" is performed by applying the voltage on the respective bit line to the gate of the respective keeper transistor.

For example, a logic state read from one of the memory cells 20 may require that first bit line 16 be held high while the charge on second bit line 18 is allowed to decay to a lower state. In this case, as the charge state on bit line 18 drifts low, the voltage signal at the gate of first keeper transistor 86 switches the transistor "on." When transistor 86 goes "on," the supply voltage $V_{dd}$ is applied to first bit line 16 to ensure that the bit line remains at the desired high logical charge state throughout the read operation.

The keeper circuit 14 also assists in producing the desired charge state on the bit lines 16 and 18 in the event that data is late at the data input DIN. When data is late at DIN and the clock signal C1 goes high, an incorrect charge state may be produced on the bit lines 16 and 18. This incorrect charge state must be corrected when the desired data arrives at DIN. When the desired data does arrive at DIN during the data propagation clock signal, the desired outputs at 30 and 32 cause the tri-state buffer to change the charge state on the bit lines 16 and 18 to the charge state representing the desired data. The low going signal on one bit line switches on the keeper transistor associated with the opposite bit line, which pulls the opposite bit line to $V_{dd}$.

The above described preferred embodiments are intended to illustrate the principles of the invention, but not to limit the scope of the invention. Various other embodiments and modifications to these preferred embodiments may be made by those skilled in the art without departing from the scope of the following claims. For example, although the illustrated tri-state buffer arrangement is preferred, other buffer arrangements may be employed within the scope of the invention. Also, other logic arrangements may be employed in the write driver logic circuit and to produce the desired clock signals from the system clocks.

What is claimed is:

1. An apparatus for maintaining a desired charge on a bit line pair during a read operation through the bit line pair, the apparatus comprising:

(a) a first switching device having a current path connecting a supply voltage source and a first bit line of the bit line pair, the current path of the first switching device being activated by a low charge state on a second bit line of the bit line pair; and (b) a second switching device having a current path connecting the supply voltage source and the second bit line, the current path of the second switching device being activated by a low charge state on the first bit line.

2. The apparatus claim 1 wherein:

(a) the first switching device comprises a first keeper transistor having its source-drain current path connecting a supply voltage source and the first bit line of the bit line pair, and having its gate connected to the second bit line of the bit line pair; and (b) the second switching device comprises a second keeper transistor having its source-drain current path connecting the supply voltage source and the second bit line, and having its gate connected to the first bit line.

3. The apparatus of claim 1 wherein:
   (a) the first switching device comprises a P-type field effect transistor; and
   (b) the second switching device comprises a P-type field effect transistor.

4. The apparatus of claim 1 wherein the bit line pair is connected to a precharge circuit for precharging both the first bit line and second bit line prior to a read operation.

5. The apparatus of claim 1 wherein the bit line pair is connected to a tri-state buffer circuit included in a write driver for the bit line pair.

6. A method for maintaining a desired charge on a bit line pair during a read operation through the bit line pair, the method comprising the steps of:
   (a) sensing a charge state on one bit line of the bit line pair;
   (b) sensing a charge state on the other bit line of the bit line pair; and
   (c) applying a supply voltage to the one bit line of the bit line pair in response to a reduction in the charge state on the other bit line of the bit line pair.

7. The method of claim 6 wherein the step of applying the supply voltage to the one bit line includes:
   (a) applying the voltage on the other bit line to activate a switching device having a current path connecting a supply voltage source and the one bit line.

8. The method of claim 7 wherein the switching device comprises a P-type field effect transistor having its gate connected to the other bit line and having its source-drain current path connecting the supply voltage source and the one bit line.

9. The method of claim 6 wherein the step of sensing the charge state on the one bit line of the bit line pair comprises:
   (a) applying the voltage signal on the one bit line to the gate of a P-type field effect transistor.

10. The method of claim 6 wherein the step of sensing the charge state on the other bit line of the bit line pair comprises:
   (a) applying the voltage signal on the other bit line to the gate of a P-type field effect transistor.

* * * * *